United States Patent
De La Grandiere et al.

(10) Patent No.: US 7,196,355 B2
(45) Date of Patent: Mar. 27, 2007

(54) INTEGRATED THERMAL SENSOR FOR OPTOELECTRONIC MODULES

(75) Inventors: Damien De La Grandiere, Marcoussis (FR); Jean-Rene Burie, Le Chatel (FR)

(73) Assignee: Avanex Corporation, Fremont, CA (US)

(*) Notice: Subject to any disclaimer, the term of this patent is extended or adjusted under 35 U.S.C. 154(b) by 238 days.

(21) Appl. No.: 10/519,334

(22) PCT Filed: Mar. 4, 2004

(86) PCT No.: PCT/IB2004/000960

§ 371 (c)(1),
(2), (4) Date: Dec. 22, 2004

(87) PCT Pub. No.: WO2004/079399

PCT Pub. Date: Sep. 16, 2004

(65) Prior Publication Data

US 2005/0226290 A1 Oct. 13, 2005

(30) Foreign Application Priority Data

Mar. 7, 2003 (FR) .................................. 03 02829

(51) Int. Cl.
*H01L 33/00* (2006.01)

(52) U.S. Cl. .................... 257/81; 257/84; 257/E33.075; 372/34

(58) Field of Classification Search ............ 257/80–84; 372/34
See application file for complete search history.

(56) References Cited

U.S. PATENT DOCUMENTS 6,998,587 B2* 2/2006 Kirkpatrick et al. ........ 219/542

FOREIGN PATENT DOCUMENTS

| EP | 0 578 883 | 1/1994 |
| EP | 1 229 315 | 8/2002 |
| EP | 1 233 488 | 8/2002 |
| JP | 1245585 | 9/1989 |

OTHER PUBLICATIONS

Magistrali F. et al., ESD-Related Latent Failures of ingaAsP/InP Laser Diodes For Connumication Equipments, Proceedings of the Annual Reliability Physics Symposium, Las Vegas, Apr. 9-11, 1991, New York, IEEE, U.S. vol. SYMP. 29, Apr. 9, 1991, pp. 224-233, XP010041339, ISBN: 0-87942-680-2, paragraph '05.2!.

Wallon J., et al., Sensitivity to Electrostatic Discharges of Low-Cost 1.3 Mum Laser Diodes: A Comparative Study, Materials Science and Engineering B, Elsevier Sequoia, Lausanne, CH, vol. 28, No. 1/3, Dec. 1, 1994, pp. 314-318, XP004012686, ISSN: 0921-5107, paragraph '003!—paragraph '0004!.

International Search Report, International Application No. PCT/IB2004/000960, dated Sep. 1, 2004.

\* cited by examiner

*Primary Examiner*—Minh-Loan Tran
(74) *Attorney, Agent, or Firm*—Patterson & Sheridan, L.L.P.

(57) ABSTRACT

An optoelectronic module comprising at least one optical component placed on a support, said component comprising an active optical layer and at least one confinement layer which carries at least one electrical contact, wherein said module further comprises a thermal sensor comprising a temperature-dependent resistive material which extends over the confinement layer of the optical component, at the side of the electrical contact of said component.

9 Claims, 3 Drawing Sheets

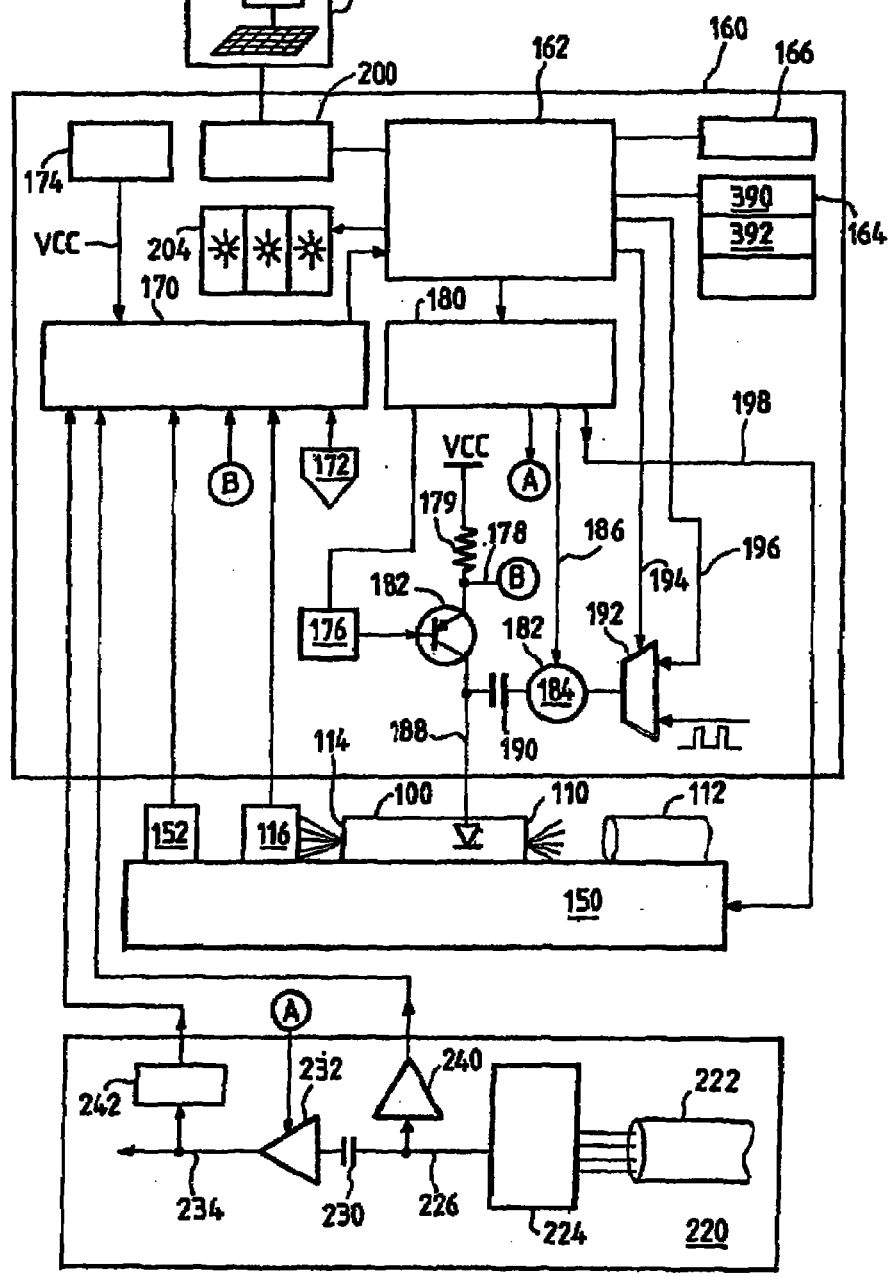
FIG_1 (PRIOR ART)

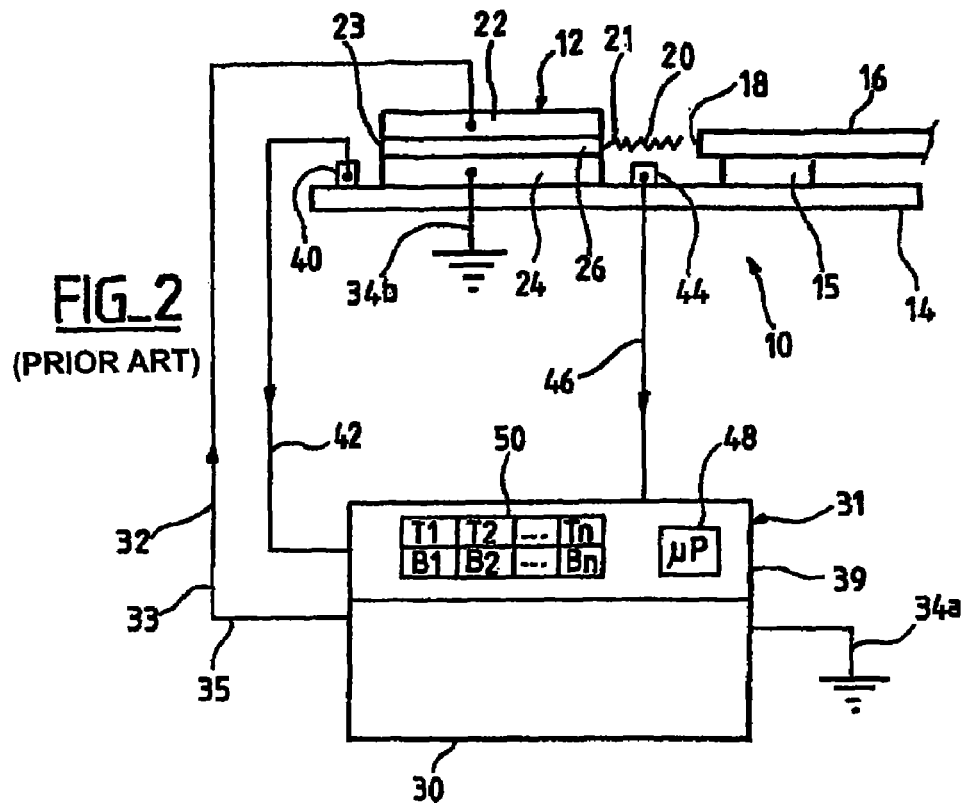
FIG_2 (PRIOR ART)
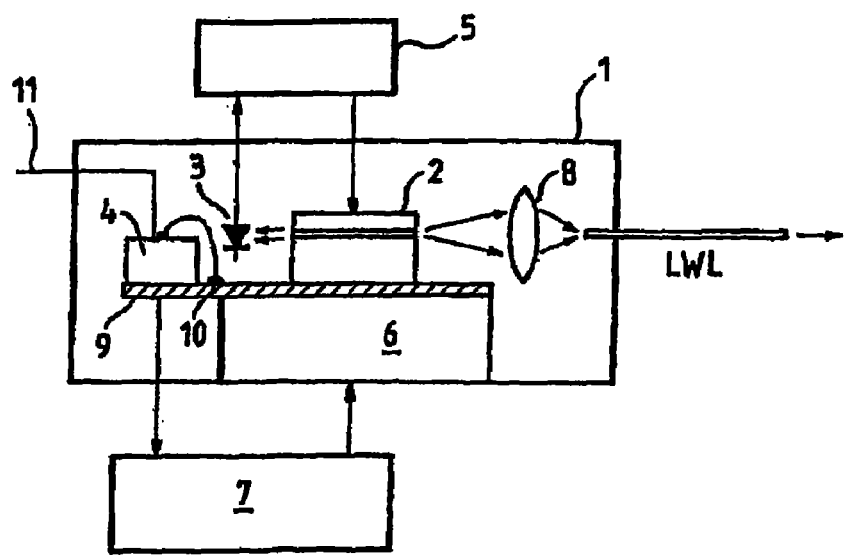
FIG_3 (PRIOR ART)

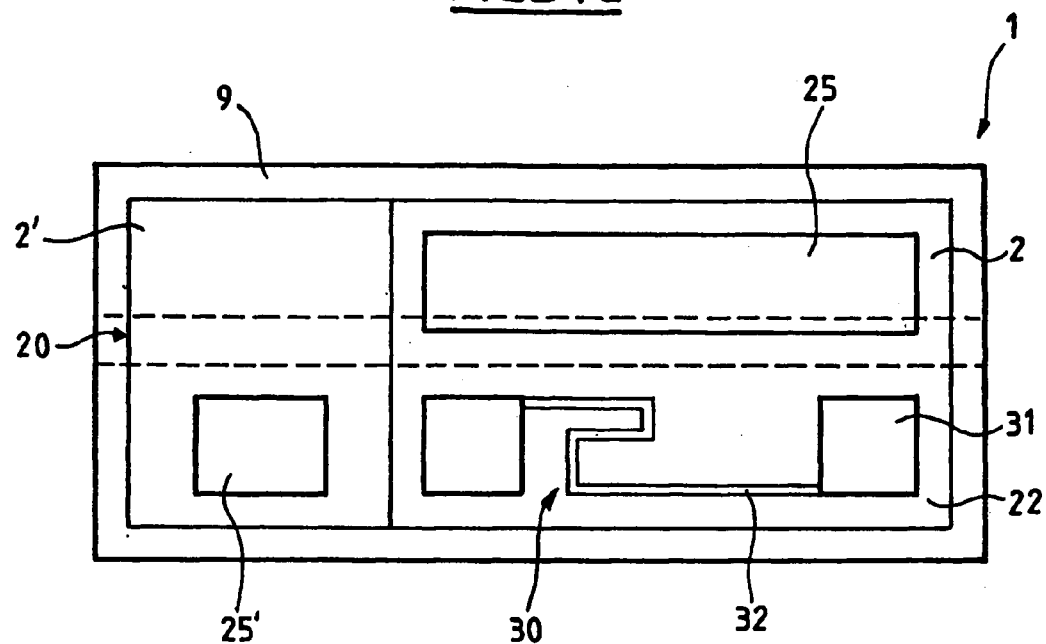
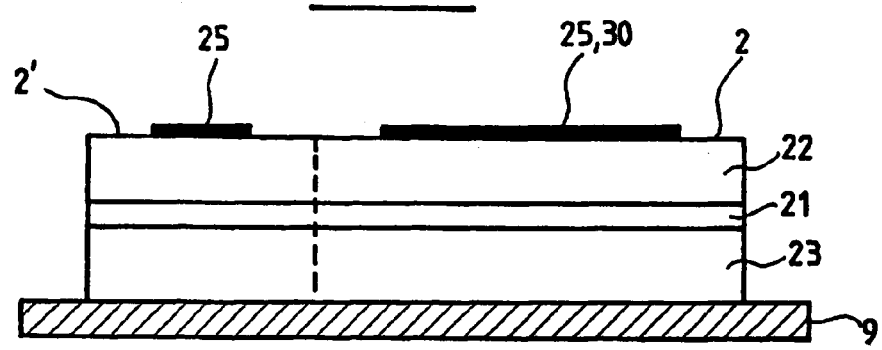

INTEGRATED THERMAL SENSOR FOR OPTOELECTRONIC MODULES

The present invention relates to the field of optoelectronic modules. Such modules usually comprise at least one optical component, called the optical chip, which is placed on a support, and at least one set of electrical contacts placed on said support and intended to control and/or regulate said optical component.

Depending upon the application, the optical component can be active, i.e. emit or transform a light signal, such as a laser or a modulator, or it can be passive, i.e. detect or filter a light signal, such as a detector or an optical filter. The support is made of an insulating material, such as a silicon substrate, a plastic support, or other, depending on the application. The electrical contacts are usually formed by metallisations on the surface of the substrate or component, or by any other deposit of electrically conductive material on the support.

Very generally speaking, an optical component, or chip, is composed of a layer, said to be active, which allows a light signal in the form of an optical wave to be emitted, guided or detected, and is further composed of at least two confinement layers which bound the active layer. Contact layers are also disposed below and above the confinement layers so that an electrical current can be injected through the optical component.

Most optical components are sensitive to temperature, i.e. temperature variations bring about a change in their operating point, which can bring about optical losses so much so that the component is caused to malfunction. Thus, the temperature is strictly controlled in an optoelectronic module by the use of a temperature sensor connected to a Peltier type cooler. Preferably, the thermal sensor must be placed as close as possible to the optical component in order to transmit to the Peltier element the most accurate indication about the heating of said component.

A solution such as this is implemented in U.S. Pat. No. 5,019,769 and illustrated in FIG. 1. A temperature sensor 152 is placed on a substrate at the side of optical components 100 and 116 (a laser and a photodiode). The electric signal of the temperature sensor is processed and permits regulation of a cooling member 150 mounted on the substrate on which the optical components 100 and 116 are disposed.

Another solution, described in European Patent Application EP 1 233 488 and illustrated in FIG. 2, consists of processing the information from a temperature sensor 40 so as to adapt the operating point of an optical component 12 (a laser) as a function of differences in temperature, rather than keeping the temperature constant in said optical component 12. This solution also requires the presence of a temperature sensor 40 positioned as close as possible to the optical component 12 on the same substrate 14.

In a known manner, a temperature sensor of this kind can be formed from two metal faces which bound a resistive material, such as a metal oxide, the resistance of which is directly dependent upon temperature. A measuring system can thus deduce temperature variations from it.

The temperature sensor is designed as a component which is independent of the optical component and which must be soldered to the support as close as possible to the optical component. This solution has certain drawbacks. Firstly, the cost of the temperature sensor, and in particular the cost/time of transferring and connecting it to the support of the optoelectronic module, is not insignificant. Secondly, the footprint of the sensor can be as much as about 1 mm$^2$, which makes it necessary to increase the size of the support and thus of the optoelectronic module.

Finally, the heat capacity of such a temperature sensor is not optimum. In fact, the sensor has to be located at a distance away from the optical component because of its dimensions, and this has two main consequences: firstly, there is a divergence between the temperature of the active layer of the optical component and the temperature measured by the sensor, and secondly, and more critically, a temperature change in the active layer of the optical component may not bring about a temperature change at the location of the sensor, and therefore may not be detected and corrected.

This problem has been identified in part in EP 0 961 371, and a solution has been proposed which is illustrated in FIG. 3. The temperature sensor 4 has a direct electrical connection 10 to the substrate 9 in order to get closer to the optical component 2 for the purpose of determining the reference temperature which will give the command to activate the Peltier member 6. This solution does, indeed, offer an improvement to the reliability of determining the reference temperature. However, a temperature offset can still exist in relation to the temperature of the active layer of the optical component, particularly when there is an increase in operating current for the purpose of increasing the output power of a laser chip, for example. Furthermore, the other drawbacks mentioned hereinabove (cost and bulk) are not resolved by EP 0 961 371.

An object of the present invention is therefore to resolve the drawbacks of the prior art, and, in particular, to propose to measure temperature variations using a thermal sensor which is completely representative of the temperature variations of an optical component.

To this end, the invention proposes to integrate the thermal sensor directly into the optical component itself.

According to the invention, it is thus possible to guarantee reliability in measuring temperature variation at the location of the optical component itself. The invention also makes it possible to simplify assembly constraints to a considerable extent, and it also makes it possible to manufacture optoelectronic modules which are smaller in size.

The invention provides an optoelectronic module comprising at least one optical component placed on a support, said component comprising an active optical layer and at least one confinement layer which carries at least one electrical contact, characterised in that said module further comprises a thermal sensor comprising a temperature-dependent resistive material which extends over the confinement layer of the optical component, at the side of the electrical contact of said component.

According to one advantageous embodiment, the thermal sensor comprises a wire of temperature-dependent resistive material which extends between two separate electrical contacts of the contact of the optical component.

According to the invention, the temperature sensor is placed on the optical component itself, permitting better integration into the optoelectronic module and greater reliability in measuring the temperature variations of the optical component.

Details and advantages of the present invention will become apparent from reading the following description, given by way of illustrative and non-limitative example, and with reference to the accompanying drawings, wherein:

FIG. 1 illustrates a first prior art optoelectronic module;

FIG. 2 illustrates a second prior art optoelectronic module;

FIG. 3 illustrates a third prior art optoelectronic module;

FIGS. 4a and 4b illustrate schematically a bottom view and a side view, respectively, of an optoelectronic module according to an embodiment of the invention.

With reference to FIGS. 4a and 4b, an integrated laser modulator component will be described by way of example which is known as an ILM (Integrated Laser Modulator). The module 1 comprises at least one optical component 2 placed on a support 9. In the illustrative drawings, the optical component 2 is a laser component and can be associated with a modulator 2' so as to form an ILM. A component 2, 2' of this kind comprises a waveguide 20 which is embedded in the component in the form of a ribbon or strip, called mesa, for example. The optical component 2 is constituted by a so-called active layer 21 surrounded by a lower confinement layer 23 and a upper confinement layer 22.

The optical component 2, 2' further comprises electrical contacts 25, 25' placed on the upper confinement layer 22. A ground electrical contact is also provided by the support 9. The contact 25 thus allows an electrical signal to be injected through the optical component 2 in order to modify the properties of the active layer 21 and to thus act upon the operation of said component 2.

The module comprises a thermal sensor 30 made of a temperature-dependent resistive material. An important feature of the module is that the sensor 30 extends over a confinement layer 22 of the optical component 2, at the side of an electrical contact 25. Depending on the application, the sensor can be placed either on the upper confinement layer 22, at the side of the electrical contact 25 for the injection of current; or on the lower confinement layer 23, at the side of the ground contact. This arrangement depends upon the design of the component.

According to one embodiment, the thermal sensor 30 is made of a wire 32 of temperature-dependent resistive material which extends between two separate electrical contact pads 31 of the contact 25. Depending upon the application, the composition of the wire 32 can include platinum (Pt) and/or nickel (Ni) and/or copper (Cu), for example. The wire 32 is also of a suitable size for the type of component on which it is placed and depends on the composition of the resistive material selected. In this way, the length, width and thickness are selected in accordance with the application so as to give adequate resistivity. In the case of an ILM, a wire with a resistance of 100Ω at 0° C. is well suited.

It is clear from the above that the thermal sensor 30 is fully integrated into the optical component 2 and thus measures temperature variations of said component directly.

The thermal sensor can thus be connected to a cooling member, e.g. of the Peltier type, in order to keep the temperature of the component constant; or it can be connected to regulate the electrical control of the component to enable the operating point of the optical component to be adjusted in response to temperature variations.

The invention claimed is:

1. An optoelectronic module comprising:
    at least one optical component placed on a support, said component comprising an active optical layer,
    at least one confinement layer, and
    at least one electrical contact contacting the confinement layer, characterized in that said module further comprises a thermal sensor comprising a temperature-dependent resistive material which extends over the at least one confinement layer, at the side of the electrical contact.

2. The optical module according to claim 1, wherein the thermal sensor comprises a wire of temperature-dependent resistive material which extends between two separate electrical contact areas of the at least one electrical contact.

3. The optical module according to claim 1, wherein the resistive material contains platinum.

4. The optical module according to claim 1, wherein the resistive material contains nickel.

5. The optical module according to claim 1 4, wherein the resistive material contains copper.

6. The optical module according to claim 1, wherein the support comprises a cooling member which regulates the temperature of the optical component as a function of temperature variations measured by the thermal sensor.

7. The optical module according to claim 1, further comprising means for regulating the electrical control of the component as a function of temperature variations measured by the thermal sensor.

8. The optical module according to claim 1, wherein the optical component is a laser.

9. The optical module according to claim 1, wherein the optical component is a modulator.

* * * * *